United States Patent [19]
Ramus et al.

[11] Patent Number: 5,631,492
[45] Date of Patent: May 20, 1997

[54] STANDARD CELL HAVING A CAPACITOR AND A POWER SUPPLY CAPACITOR FOR REDUCING NOISE AND METHOD OF FORMATION

[75] Inventors: Richard S. Ramus; James R. Lundberg, both of Austin, Tex.

[73] Assignee: Motorola, Schaumburg, Ill.

[21] Appl. No.: 632,690

[22] Filed: Apr. 15, 1996

Related U.S. Application Data

[63] Continuation of Ser. No. 184,167, Jan. 21, 1994, abandoned.
[51] Int. Cl.⁶ .................................................. H01L 29/00
[52] U.S. Cl. .................................... 257/532; 257/401
[58] Field of Search ............................. 307/576; 257/299, 257/207, 208, 532, 401

[56] References Cited

U.S. PATENT DOCUMENTS

| | | | |
|---|---|---|---|
| 4,626,881 | 12/1986 | Kishi et al. | 257/532 |
| 5,264,723 | 11/1993 | Strauss | 257/532 |

FOREIGN PATENT DOCUMENTS

| | | | |
|---|---|---|---|
| 59-55047 | 3/1984 | Japan | 257/532 |
| 63-308366 | 12/1988 | Japan | 257/532 |
| 2137256 | 5/1990 | Japan | |
| 2189951 | 7/1990 | Japan | |
| 5-82741 | 4/1993 | Japan | 257/532 |
| 5-82733 | 4/1993 | Japan | 257/532 |
| 8904553 | 5/1989 | WIPO | |

*Primary Examiner*—Jerome Jackson
*Assistant Examiner*—Nathan K. Kelley
*Attorney, Agent, or Firm*—Keith E. Witek

[57] ABSTRACT

An integrated circuit (10), which is designed using standard cells (20, 22, 24, 26, 28, 30, 32, 34, 35, 36, 37, 28, 40, 42, 44, 46, 48, 50, 52), usually has one or more empty spaces (54) wherein no circuitry is formed. These empty spaces may be used to form capacitor standard cells which have capacitors (see FIGS. 3 and 4) to both ground and power supply lines within the integrated circuit. These capacitors are used to reduce noise in the power and supply lines in a manner more useful/efficient than known methods. The capacitor standard cell taught herein is more useful/efficient due to the fact that the capacitance provided by these standard cells is distributed over the entire integrated circuit in small portions (i.e., standard cells are placed all over the integrated circuit (10)), and is placed close to the logic which is switching. It is the switching logic which is the root of a large portion of internal integrated circuit noise.

18 Claims, 3 Drawing Sheets

STANDARD CELL HAVING A CAPACITOR AND A POWER SUPPLY CAPACITOR FOR REDUCING NOISE AND METHOD OF FORMATION

This application is a continuation application Ser. No. 08/184,167, filed on Jan. 21, 1994 entitled A STANDARD CELL HAVING A CAPACITOR AND A POWER SUPPLY CAPACITOR FOR REDUCING NOISE AND METHOD OF FORMATION now abandoned.

FIELD OF THE INVENTION

The present invention relates generally to semiconductor circuits, and more particularly, to a standard cell decoupling capacitor circuit.

BACKGROUND OF THE INVENTION

Current capacitive methods and structures for reducing noise on an integrated circuit (IC) are not always adequate. For example, previous implementations of capacitance would include a capacitor residing on the circuit board or package containing the device. Such capacitance is inherently inferior to a capacitance directly resident on the semiconductor device because it is isolated by the board and package inductance, thus severely reducing its effectiveness in providing noise immunity. Another prior art method is to include capacitors on an integrated circuit but place the capacitors far from the switching logic in which it is to reduce noise (usually capacitors are positioned at the periphery of an IC, and not in standard cell layout blocks). Again, other capacitances, line resistance, inductance, timing delays, and physical separation reduce the effectiveness of this technique. In other words, by not being located immediately adjacent to the standard cells, a significant amount of resistance (etc.) exists between the capacitor cells and the actual switching logic. This reduces the amount of transient current the capacitor can provide, which limits its noise suppression capability and will slow down the speed of the switching circuits. Widening the metal conductors connecting the switching logic to the capacitor cells would overcome this, but at the expense of device area consumed by the widened power and ground buses. Another prior art method is to use the inherent capacitance in the well and substrate normally present in the spacer cells of a standard cell block as the capacitor cell. The severe drawback to this is the total amount of capacitance provided is not nearly enough to suppress any noise appearing on the power and/or ground conductors. At least two orders of magnitude greater capacitance must be provided to accomplish a reduction in power and ground noise.

SUMMARY OF THE INVENTION

The previously mentioned disadvantages are overcome and other advantages achieved with the present invention. In one form, the present invention comprises an integrated circuit having a first standard cell, a second standard cell, and a capacitor circuit. The first standard cell performs a predetermined function and has a power conductor and a ground conductor. The second standard cell performs a predetermined function and has the power conductor and the ground conductor. The capacitor circuit has a first conductive region coupled to the power conductor. The first conductive region overlying a first active region which is coupled to the ground conductor. The capacitor circuit has a second conductive region separated from the first conductive region wherein the second conductive region is coupled to the ground conductor. The first conductive layer overlies a second active region which is coupled to the power conductor.

In another form, the invention comprises an integrated circuit standard cell, a standard cell layout, and a semiconductor device structure.

In yet another form, the invention comprises a method for forming an integrated circuit. The method begins by providing a substrate. A gate oxide dielectric layer is formed overlying the substrate. A conductive layer is formed overlying the gate oxide dielectric layer. The conductive layer is patterned wherein a first portion of the conductive layer forms at least one standard cell capacitor between the substrate and the conductive layer, and a second portion of the conductive layer is used as a gate electrode for a standard cell logic device.

The present invention will be more clearly understood from the detailed description below in conjunction with the accompanying drawings.

Figure 1:
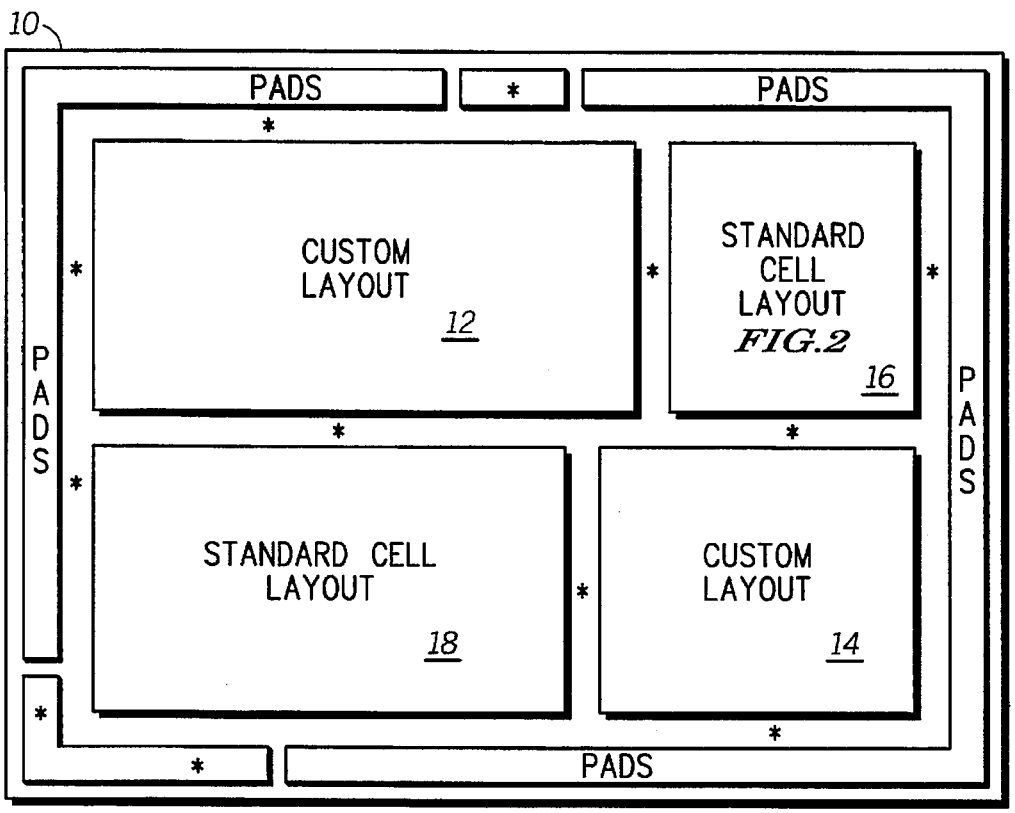
FIG. 1 illustrates, in a top perspective view, an integrated circuit having standard cells in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention provides a circuit, a layout, and/or a semiconductor device which is implemented as a standard cell for use in a data processor or an integrated circuit. The circuit, layout, and/or semiconductor device which is implemented as a standard cell includes at least one capacitor and is, in a preferred form, placed several times in several locations within an integrated circuit to reduce power supply and ground supply noise internal to the integrated circuit, and to improve switching speed of the circuits in the integrated circuit. Specifically, the present invention provides a standard cell design with high capacitance (around 20 nF) located adjacent to a group of standard cell logic (i.e., NAND, NOR, multiplexor, flip-flop, counter, etc.). The capacitor is formed as a power capacitor and a ground capacitor which are physically located next to each other so as to maximize the effect of the capacitors, and minimize the area and process yield implications.

The present invention overcomes many of the disadvantages stated above and can be more fully understood with reference to the FIGS. 1–6. FIG. 1 illustrates an integrated circuit die (IC) 10 which has several circuit sections. The integrated circuit die 10 has a custom layout section 12 and a custom layout section 14. A custom layout section may be defined as a section of the integrated circuit where the physical patterning of the various layers are done manually with the only purpose of occupying the exact location defined in the integrated circuit (i.e., the layout is done one time for one specific place).

The integrated circuit die (IC) 10 of FIG. 1 also contains a standard cell layout section 16 and a standard cell layout section 18. A standard cell layout section may be defined as a section of the integrated circuit which utilizes layout which has been produced in a modular, or cellular fashion. In many cases, layout of a group of standard cells is computerized and automatic to a large extent. A standard cell region of an IC could be distinguished by the layout cell height, its port or terminal locations for the power and ground conductors, the width of the metal power and ground conductors, and the general location for both the PMOS and NMOS transistors. Each layout cell produced in this manner can then be assembled with other like cells and grouped together in any order necessary to produce the most effective layout possible.

Typically, each standard cell within a group of standard cells represents a common logic function (i.e., NAND, NOR, AOI, buffer, multiplexor, flip-flop). The fact that the standard cells are designed to perform common functions allows them to be placed in several locations throughout the IC. Circuitry which performs often-repeated logic functions are likely candidates for standard cell use. The IC 10 also contains a pad section 20. This section is where the metal conductors in the integrated circuit package connect to the corresponding wires on the IC 10. Bond pads in a top layer of metal are used to connect the integrated circuit to wires of an IC package which through pins or like metal formations are connected to external circuitry. The initial input or output buffer circuits may also be placed here, which would couple output or input signals to other sections of the IC 10.

The pad section 20 may often leave empty spaces around the perimeter of the IC 10 when there are fewer signals to connect to the package than the peripheral area of the IC 10 can support. These empty spaces are marked with a '*' symbol in FIG. 1, as are other locations in the IC 10 which may have empty spaces where there are only conductor layers present. In general, standard cell design creates more empty spaces than custom layout due to its repeated and mechanized nature. The locations marked with a '*' are typically where a capacitor cell as taught herein, if any are used, would be placed in the IC 10.

A capacitor cell is a standard cell type which may be defined as a layout on the IC 10 which contains no logic function, but only serves to connect some type of capacitor between the power conductor and the ground conductor. A capacitor cell provides some noise immunity to the power and ground conductors by supplying some of the necessary transient current during a switching event within the IC 10. The larger the capacitor and the closer it is to the switching logic (either standard cell blocks or custom blocks) the more effective the capacitor cell is.

Figure 2:
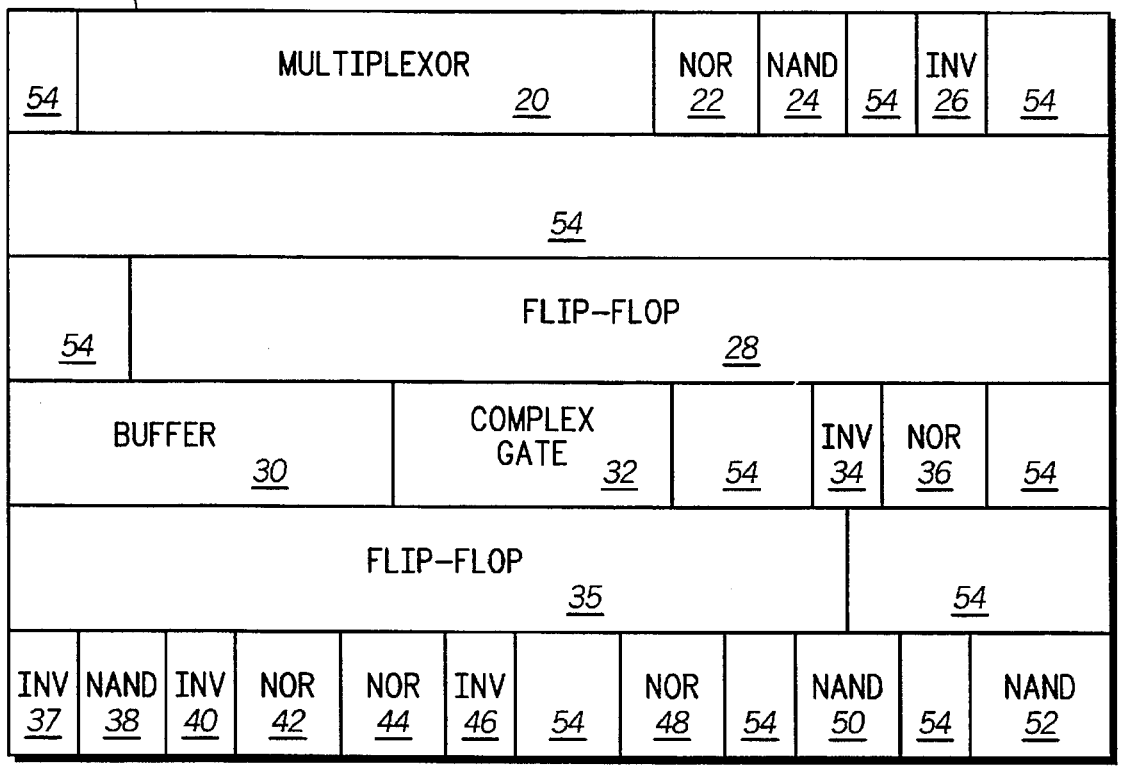
FIG. 2 illustrates, in a top perspective view, a standard cell logic block portion of an integrated circuit in accordance with the present invention.

FIG. 2 illustrates one possible example of the standard cell layout portion 16 in more detail. FIG. 2 illustrates a multiplexor 20, a NOR gate 22, a NAND gate 24, and inverter 26, a flip-flop 28, a buffer 30, a complex gate 32, an inverter 34, a NOR gate 36, a flip-flop 35, an inverter 37, a NAND gate 38, an inverter 40, a NOR gate 42, a NOR gate 44, an inverter 46, a NOR gate 48, a NAND gate 50, and a NAND gate 52, each of which comprise some portion of the standard cell layout portion 16. The placement of the above-numbered blocks is typically performed by an automated place-and-route tool, which optimizes the over-all area of the standard cell layout portion 16, and also minimizes the total conductor length which interconnects the I/O terminals of all the various standard cell blocks. Note that the number, type and placement of the standard cell blocks is just an example of one possible standard cell layout. Any logic function may be represented in a standard cell, and there an infinite number of possible combinations and placements of the standard cell blocks.

FIG. 2 also illustrates several spacer cells 54. A standard cell layout portion (such as portion 16) will usually have one or more empty spaces (areas in which the substrate does not contain active devices such as transistors). These empty spaces may vary in size as illustrated in FIG. 2. The spacer cells 54 are typically used to provide feedthrough connections for the power and ground conductors of the standard cell blocks. Note that the spacer cell 54 must exist in order for the place-and-route tool to attempt various standard cell block placement configurations and also to permit enough room for the needed interconnect channels. The spacer cells 54 are of different sizes, because they merely fill up unused holes of standard cell blocks. Since these empty spaces are very close to the actual switching logic, they are very good positions in which to have capacitor cells formed in order to reduce IC noise.

Figure 3:
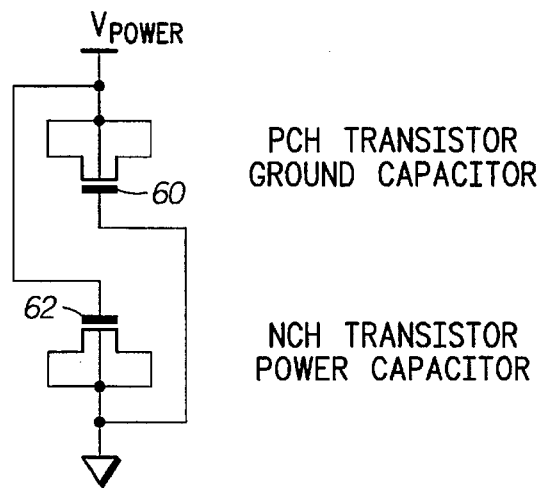
FIG. 3 illustrates, in a circuit schematic, a capacitor circuit standard cell used for reducing signal noise, the cell being in accordance with the present invention.

FIG. 3 illustrates a capacitor cell schematic diagram of a circuit which is placed in the * positions of FIG. 1 and the spacer cells 54 in FIG. 2. FIG. 3 illustrates two capacitors: a ground capacitor 60 and a power capacitor 62. Each capacitor is really a MOS transistor with its source and drain nodes electrically connected together. The first electrode of the capacitor is the gate region of the MOS transistor, and the second electrode of the capacitor is the common source/drain region of the MOS transistor, a well region, a diffusion region, a channel region, an inverted channel region, or a like substrate region. The capacitor cell uses two discrete capacitors for two reasons. First, all the standard cells are arranged with the P-channel transistors in the upper portion of the cell and the N-channel transistors in the lower portion of the cell. This is because the large design rules of the well layer which surrounds the P-channel transistors encourages the N-channel and P-channel transistors in each standard cell to be appropriately placed so as to create one long strip of the well layer containing all the P-channel transistors. Having only one type of capacitor would cause breaks in the well and require greater spacing (or less capacitor surface area and therefore reduced capacitance) adjacent to standard cells.

Also, the present configuration of FIG. 3 allows the gate node of each capacitor to directly contact a reverse-biased P-N junction. That is, the gate of the ground capacitor is connected to the source/drain of the power capacitor which is an N+ implant in a P-type well or substrate. Likewise, the gate of the power capacitor is connected to the source/drain of the ground capacitor which is a P+ implant in an N-type well or substrate. Such a configuration greatly enhances the yield of the capacitor cells when being fabricated (known charging of layers via plasma processing is reduced). In other words, all process steps which could build an electrical charge on the isolated gate node, such as a plasma etch or metal deposition, now are provided a current path to discharge the isolated gate node through the above-mentioned P-N junction.

Note that both the ground capacitor 60 and the power capacitor 62 are biased in the "ON" state. Specifically, the ground capacitor 60 has a gate voltage at the ground potential and the source voltage at the power potential. As long as the threshold voltage (Vt) for the P-MOS 60 transistor is less than the power supply voltage (which is usually the case as |Vt| is typically 0.5–1.5 volts), the transistor will have a channel or inversion region located directly beneath the gate. This inversion region electrically connects the second electrode of the capacitor to the source/drain node contacts. Likewise, the power capacitor 62 (implemented as a N-MOS transistor) has a gate voltage at the power potential and the source voltage at the ground potential. This will create a channel, providing |Vt| for the power capacitor is less than the power supply voltage. As an additional note, a permanently "ON" transistor may be created by adding an extra implant of the same polarity and dose as the source/drain implant( referred to as a threshold adjust implant in many cases). Such an implant placed in the channel or inversion region, if available, would create a circuit connection from the second electrode of the capacitor to the ground or power potential in a less resistive manner than through the inversion region without such an implant.

Figure 4:
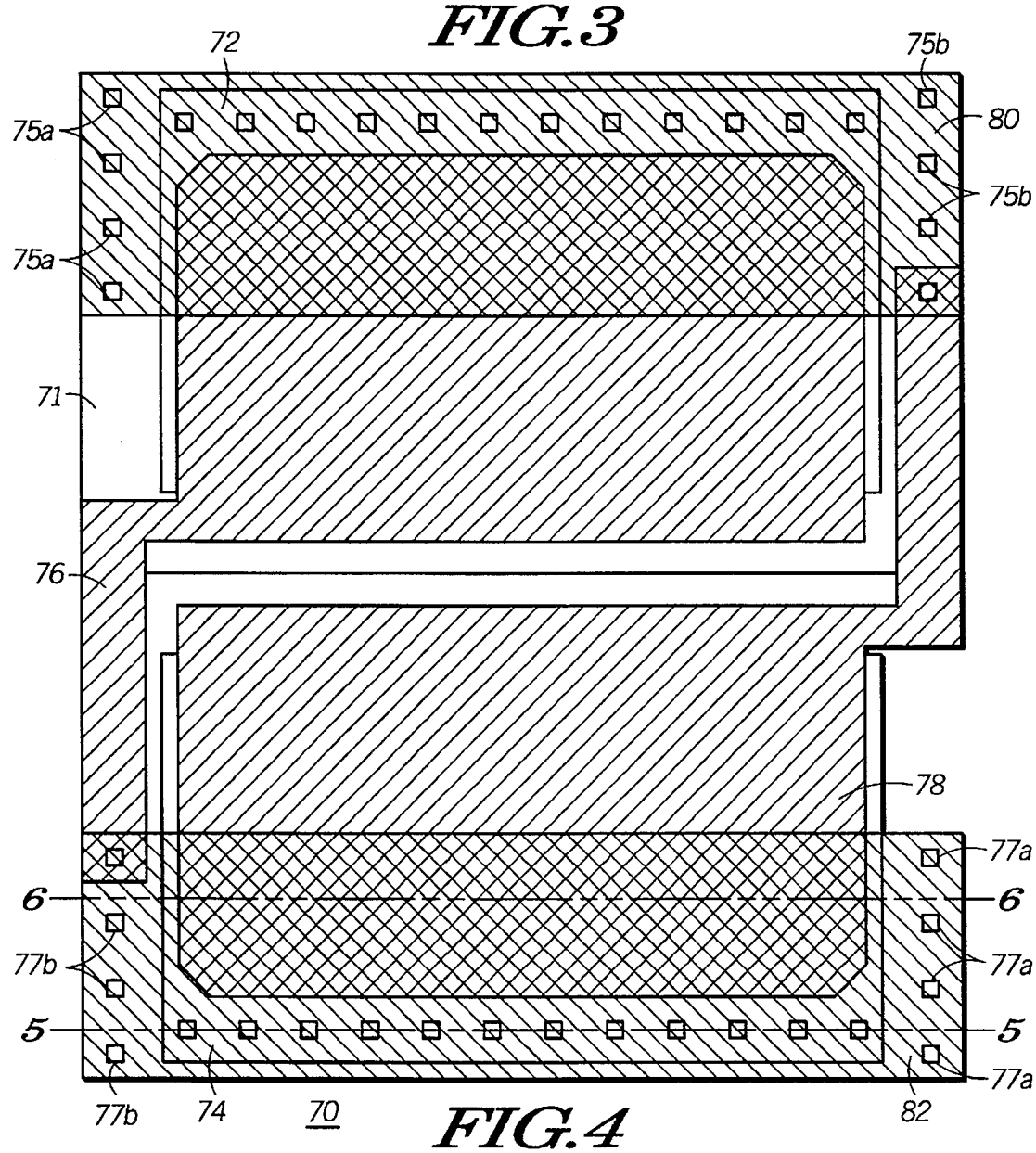
FIG. 4 illustrates, in a top perspective view, a capacitor layout for the circuit of FIG. 3 in accordance with the present invention.

FIG. 4 illustrates a semiconductor device and a semiconductor layout of a capacitor standard cell in accordance with the circuit of FIG. 3. In its present embodiment there is a substrate 70 made of P-type material, such as boron doped silicon. A N-type well implant 71 is used for the formation of the ground capacitor. The power capacitor is formed directly in the P-type substrate 70. A nitride region is typically used to define an active layer 72, and a nitride region is typically used to define an active layer 74. Active regions are areas of substrate where field oxide (or a like isolation scheme, such as trench isolation) is not allowed to grow/form, but instead is used to form active devices, such as transistors, in/from the substrate. For the power capacitor, N-type dopant (such as arsenic or phosphorus) will be implanted in the active region 74, and for the ground capacitor, P-type dopant (such as boron) will be implanted in the active region 72. Contacts 75a and 75b (which usually include a heavily doped N+ diffusion region) are used to connect the well 71 to the conductor 80. Contacts 77a and 77b (which usually include a heavily doped P+ diffusion region) are used to connect the substrate 70 to the conductor 82.

A polysilicon region 76, and a polysilicon region 78 are deposited and patterned on a thin gate oxide (50–150 Angstroms thick) and forms gate regions of the two transistors/capacitors 60 and 62 of FIG. 3. Note that the N-type and P-type dopants mentioned above are source/drain implants for the power and ground capacitors. As such, they do not exist significantly underneath the polysilicon regions 76 and 78 in most cases. Instead, a channel region (or inversion region) is formed directly underneath the polysilicon regions 76 and 78 because the transistors are in the "ON" state. Typically, the channel has a dopant concentration equivalent to the opposite dopant concentration existing beneath it. For example, a N channel is formed over a P substrate. For the power capacitor, the N-type channel has a same or greater mobile doping concentration as the doping concentration of the P-type substrate 70 beneath it; similarly, the ground capacitor has a P-type channel a mobile concentration which is the same or greater than the dopant concentration of the N-type well implant 71 beneath it. If available in the process, an additional implant of the polarity of the source/drain implant may occur before the polysilicon is deposited, resulting in a permanent channel or inversion region and creating a permanently "ON" transistor regardless of the gate voltage. This implant will reduce the parasitic resistance of the ground and power capacitors.

FIG. 4 also illustrates a metal power conductor 80 and a metal ground conductor 82. Contact regions exist to connect the metal power and ground conductors 80 and 82 to the active regions 72 and 74 to form the source/drain contact, and to the polysilicon regions 76 and 78 to form the gate contact. Contact regions also exit to connect the metal power and ground conductors 80 and 82 to well and substrate ties formed around the perimeter of the transistors. In the present embodiment, the metal layer shown forming the power and ground conductors is the first of two or more metal layers which are deposited on the IC 10 (typically three to four metal layers are used). The succeeding two metal layers are used in the standard cell layout regions 16 and 18 exclusively for signal interconnections, a task accomplished by an automated signal router. It is significant that the capacitor cells can be formed without having to include the upper two metal layers, thus not enlarging the area of the standard cell layout regions 16 and 18.

Figure 5:
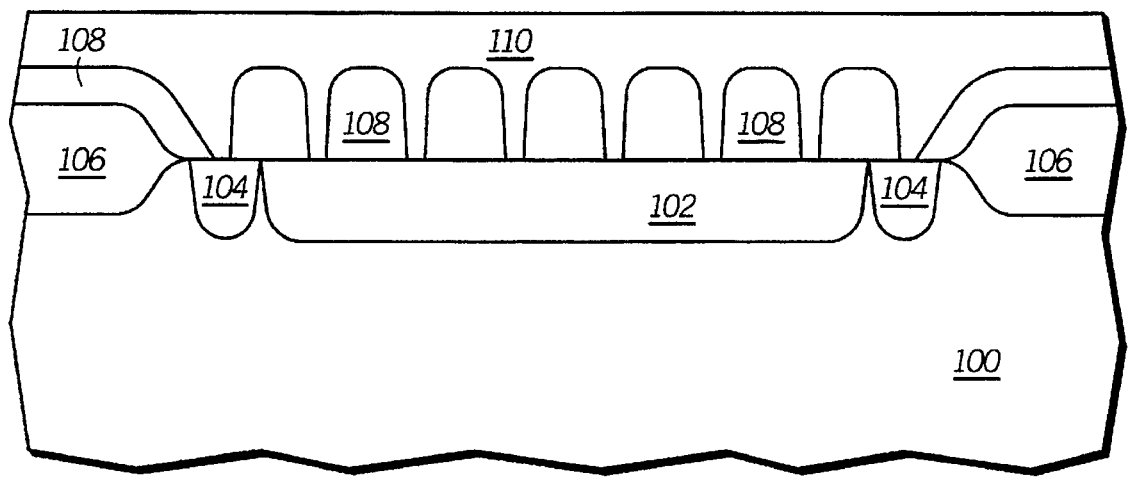
FIG. 5 illustrates, in a cross-sectional diagram, a cross-section of the FIG. 4 along line B–B' in accordance with the present invention.

FIG. 5 illustrates a cross-sectional view of FIG. 4 cross-sectional along a line 5. A P-type substrate 100 corresponds to the P-type substrate 70 in FIG. 4. A field region 106 is grown in the area where the active region 74 from FIG. 4 is not located. The active region 74 of FIG. 4 prevents field oxide growth, and allows an N-type implant 102 to provide the source/drain regions (which are coupled together) for the transistor. A P-type implant 104 provides substrate tie regions on either side of the N-type source/drain implant. An inter-layer dielectric 108 is used to isolate a metal ground conductor 110 from the N-type source/drain implant 102 and other regions of the IC. The ground conductor 110 corresponds to the ground conductor 82 in FIG. 4.

Figure 6:
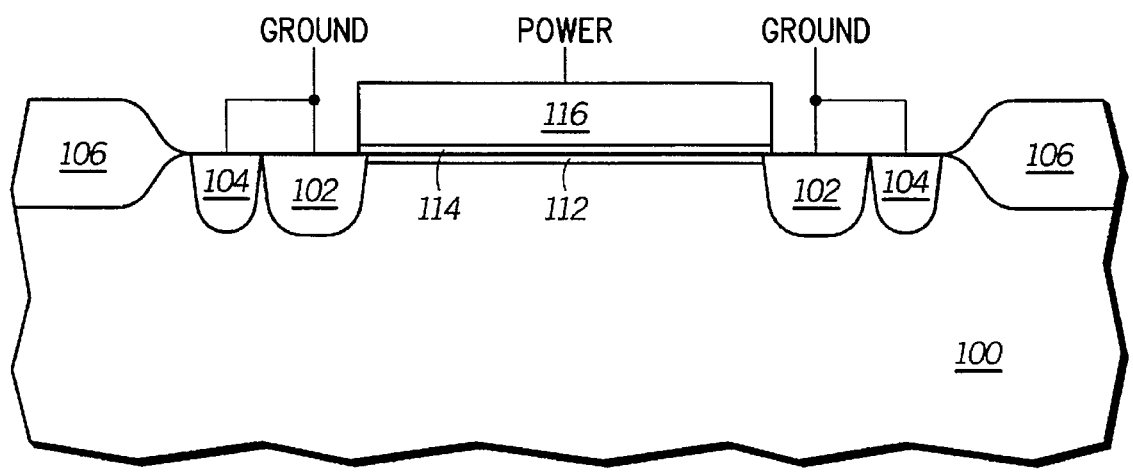
FIG. 6 illustrates, in a cross-sectional diagram, a cross-section of the FIG. 4 along line A–A' in accordance with the present invention.

FIG. 6 illustrates a cross-sectional view of FIG. 4 cross-sectional along a line 6. A P-type substrate 100 corresponds to the P-type substrate 70 in FIG. 4. A field region 106 is grown in the area where the active region 74 from FIG. 4 is not located. The active region 74 of FIG. 4 prevents field oxide growth, and allows an N-type implant 102 to provide the source/drain regions for the transistor. A P-type implant 104 provides substrate tie regions on either side of the N-type source/drain implant. A thin gate oxide region 114 is grown (roughly 50–150 Angstroms thick) which defines the transistor location and creates the high capacitance needed for the capacitor standard cell. A polysilicon layer 116 is deposited which corresponds to the polysilicon layer 78 in FIG. 4 and provides a gate terminal for the transistor. Note that the connection of the polysilicon region 116 to the power conductor creates an inversion region, or channel 112, beneath the gate oxide 114. It is the channel region 112 (inversion region) which is the second electrode of the capacitor. It is connected to the N-type source/drain implant 102, and then to the ground conductor to complete the circuit of FIG. 3.

The present invention provides a circuit, layout, and/or semiconductor device which is implemented as a standard cell for use in a data processor or an integrated circuit (IC). The circuit, layout, and/or semiconductor device which is implemented as a standard cell includes at least one capacitor and is, in a preferred form placed several times in several locations within an integrated circuit to reduce power supply and ground supply noise internal to the integrated circuit, and to improve switching speed of the circuits in the integrated circuit. With such circuits, systems, and methods as taught herein, the problem of capacitance in the circuit board or chip package is overcome by placing the capacitance on the IC 10 itself. The problem of the on-chip capacitance not being close to actual switching logic is overcome by placing the capacitor cells adjacent to the standard cells which perform the logic switching. The problem of design time and design risk from custom-designing and laying out the capacitor cells is overcome by using a repeated cell within a framework which guarantees it is connected correctly with no time increase in the project schedule. The problem of poor process yield is overcome by cross-coupling the power and ground capacitors in the same cell, ensuring a minimum of gate-oxide related processing problems. This cross-coupling is performed to reduce charge build-up on the polysilicon regions which are used to form the capacitors, because charge build-up on these polysilicon regions may cause gate oxide damage. The problem of insufficient total capacitance on-chip is overcome by forming the capacitor cell out of thin gate oxide rather than a diode configuration, providing a capacitance about 2 orders of magnitude greater.

While the present invention has been shown and described with reference to specific embodiments, further modifications and improvements will occur to those skilled in the art. For example, if an integrated circuit had an additional polysilicon layer available in its process flow, a poly-poly capacitor with a thin inter-poly dielectric could be used as the capacitor cell. Many different materials may be used to form a gate electrode besides polysilicon (like amorphous silicon, metal, refractory metals, silicides, etc.). An additional N-type or P-type implant could be used under the channel region of the capacitor to decrease series resistance to second electrode of the capacitor. Only one transistor instead of two could be used to form the capacitor cell, with an extra diffusion region added connecting to the polysilicon region to increase process yield in a manner similar to the effect of having two opposite polarity transistors in the capacitor cell. Other materials besides polysilicon could be used, or the doping concentrations of the various implants may vary. The initial substrate doping concentration may vary, or the size of the individual capacitor cell may be different. Different metal interconnections are available in the art. It is to be understood, therefore, that this invention is not limited to the particular forms illustrated and that it is intended in the appended claims to cover all modifications that do not depart from the spirit and scope of this invention.

What is claimed is:

1. An integrated circuit standard cell comprising:
    a substrate;
    a first doped substrate region within the substrate and biased to a ground voltage potential via a first metal region, the first doped substrate region having a doped portion of a first conductivity type;
    a second doped substrate region within the substrate, laterally separated from the first doped substrate region, and being biased to a power supply voltage potential via a second metal region, the second doped substrate region having a doped portion of a second conductivity type which is different from the first conductivity type;
    a gate oxide layer formed overlying the substrate; and
    a first conductive region formed overlying the first doped substrate region and separated from the first doped substrate region by the gate oxide layer, the first conducive region being biased to the power supply voltage potential which creates an inversion region in the doped portion of the first conductivity type; and
    a second conductive region formed overlying the second doped substrate region and separated from the second doped substrate region by the gate oxide layer, the second conductive region being biased to the ground voltage potential which creates an inversion region in the doped portion of the second conductivity type.

2. The integrated circuit standard cell of claim 1 wherein the first conductive region and the first doped substrate region are each an electrode of a capacitor which reduces noise on a power supply conductor.

3. The integrated circuit standard cell of claim 1 wherein the second conductive region and the second doped substrate region are each an electrode of a capacitor which reduces noise on a ground conductor.

4. The integrated circuit standard cell of claim 1 wherein the gate oxide layer has a thickness within a range of 50 angstroms to 250 angstroms.

5. A semiconductor device comprising:
    a substrate having a surface;
    a first doped region formed within the substrate, the first doped region being a P doped region which is used to support formation of N type source and drain regions within the P doped region, the P doped region forming an N-channel region
    a second doped region formed within the substrate, the second doped region being an N doped region which is used to support formation of P type source and drain regions within the N doped region, the N doped region forming a P-channel region;
    a dielectric layer formed overlying the surface of the substrate;
    a first conductive region formed overlying the dielectric layer and overlying the N-channel region;
    a second conductive region formed overlying the dielectric layer, laterally separated from the first conductive region, and overlying the P-channel region;
    a first metal conductor for providing a power supply potential, the first metal conductor being coupled to the first conductive region to form a capacitor between the first conductive region and the first doped region; and
    a second metal conductor for supplying a ground potential, the second metal conductor being coupled to the second conductive region to form a capacitor between the second conductive region and the second doped region.

6. The semiconductor device of claim 5 wherein the first conductive region is used as a capacitor electrode to reduce signal noise in the first metal conductor.

7. The semiconductor device of claim 5 wherein the second conductive region is used as a capacitor electrode to reduce signal noise in the second metal conductor.

8. The semiconductor device of claim 5 wherein a standard cell which contains at least one logic device is placed laterally adjacent the semiconductor device wherein the standard cell is coupled to the first and second metal conductors.

9. A standard cell circuit comprising:
    a P channel transistor having a drain electrode electrically coupled to a source electrode, a gate electrode overlying a channel region which is inverted to form an inversion region within a substrate, the inversion region being biased to a ground potential and the gate electrode being biased to a power supply potential; and an N channel transistor having a drain electrode electrically coupled to a source electrode, a gate electrode overlying a channel region which is inverted to form an inversion region within a substrate, the inversion region being biased to the power supply potential and the gate electrode being biased to the ground potential, the N channel transistor being laterally adjacent the P channel transistor.

10. The standard cell circuit of claim 9 wherein another standard cell circuit which comprises at least one logic device is formed laterally adjacent the standard cell circuit and is coupled to both the ground and power supply potentials.

11. The standard cell circuit of claim 9 wherein both the ground and power supply potentials have reduced electrical noise due to both the P channel transistor and the N channel transistor functioning as capacitors.

12. A standard cell layout comprising:

a substrate;

a dielectric layer formed overlying the substrate;

a power supply conductor overlying the dielectric layer;

a ground conductor overlying the dielectric layer;

a first active region defined within the substrate and being coupled to the power supply conductor through a first plurality of contact openings formed through the dielectric layer, the first active region being of a first conductivity type;

a second active region defined within the substrate and being laterally adjacent the first active region, the second active region being coupled to the ground conductor through a second plurality of contact openings formed through the dielectric layer, the second active being of a second conductivity type which is different from the first conductivity type;

a first conductive layer overlying the first active region, being separated form the first active region by a first gate dielectric region, and being coupled to the ground supply conductor through a third plurality of contact openings formed through the dielectric layer; and a second conductive layer overlying the second active region, being separated form the second active region by a second gate dielectric region, and being coupled to the power supply conductor through a fourth plurality of contact openings formed through the dielectric layer.

13. The standard cell layout of claim 12 wherein the first conductive layer is coupled via metal to a portion of the substrate so that the first conductive layer will not electrically charge to a charge level wherein the first gate dielectric region is adversely affected.

14. The standard cell layout of claim 12 wherein the second conductive layer is coupled via metal to a portion of the substrate so that the second conductive layer will not electrically charge to a charge level wherein the second gate dielectric region is adversely affected.

15. The integrated circuit standard cell of claim 1 wherein the first doped substrate region has both a P type substrate tie region and an N type diffusion region where both the P type substrate tie and the N type diffusion region are coupled to the first metal region.

16. The integrated circuit standard cell of claim 1 wherein the second doped substrate region has both an N well region and a P type diffusion region within the N well region where the P type diffusion region is coupled to the second metal region.

17. The semiconductor device of claim 5 wherein replicas of the semiconductor device are automatically placed by a place and route tool into a plurality of unused substrate areas on the surface of an integrated circuit die, wherein the plurality of unused substrate areas are areas not occupied by other standard logic cells, whereby the plurality of unused areas are coupled for a purpose of reducing power supply and ground supply noise via on-chip capacitors.

18. A semiconductor device comprising:

a substrate having a surface;

a first doped region formed within the substrate which is an N type transistor region;

a second doped region formed within the substrate which is a P type transistor region;

a dielectric layer formed overlying the surface of the substrate;

a first conductive region formed overlying the dielectric layer and in close proximity to the first doped region;

a second conductive region formed overlying the dielectric layer, laterally separated from the first conductive region, and in close proximity to the second doped region;

a first metal conductor for providing a power supply potential, the first metal conductor being coupled to the first conductive region to form a capacitor between the first conductive region and the first doped region;

a second metal conductor for supplying a ground potential, the second metal conductor being coupled to the second conductive region to form a capacitor between the second conductive region and the second doped region; and wherein replicas of the semiconductor device are automatically placed by a place and route tool into a plurality of unused substrate areas on the surface of an integrated circuit die, wherein the plurality of unused substrate areas are areas not occupied by other standard logic cells, whereby the plurality of unused areas are coupled for a purpose of reducing power supply and ground supply noise via on-chip capacitors.

* * * * *